United States Patent [19]

Ghezzo

[11] 4,040,893

[45] Aug. 9, 1977

[54] METHOD OF SELECTIVE ETCHING OF MATERIALS UTILIZING MASKS OF BINARY SILICATE GLASSES

[75] Inventor: Mario Ghezzo, Ballston Lake, N.Y.

[73] Assignee: General Electric Company, Schenectady, N.Y.

[21] Appl. No.: 676,367

[22] Filed: Apr. 12, 1976

[51] Int. Cl.² .................... H01L 21/312; B44C 1/22; C23E 1/00
[52] U.S. Cl. .................... 156/659; 156/663; 156/667; 156/904; 252/79.3; 252/79.5
[58] Field of Search .................... 156/3, 8, 11, 13, 15, 156/17, 650–657, 659, 662, 663, 664, 667, 904; 252/79.1–79.3, 79.5; 65/31; 148/187

[56] References Cited

U.S. PATENT DOCUMENTS

| 3,657,030 | 4/1972 | Porter | 156/13 |
| 3,738,880 | 6/1973 | Laker | 156/17 |
| 3,784,424 | 1/1974 | Chang | 156/15 |
| 3,811,975 | 5/1974 | Lierop et al. | 156/13 |

OTHER PUBLICATIONS

IBM Technical Disclosure Bulletin, vol. 14, No. 11, Apr. 1972, Contact Hole Etching for P-Channel Silicon Gate FETS by C. A. Barile, p. 3331.

Primary Examiner—William A. Powell
Attorney, Agent, or Firm—Julius J. Zaskalicky; Joseph T. Cohen; Jerome C. Squillaro

[57] ABSTRACT

A method of etching a layer of material on the surface of a substrate of silicon dioxide utilizes an etch mask constituted of a binary silicate glass. The binary silicate glass is removed subsequent to the etching of the layer without affecting the substrate of silicon dioxide.

13 Claims, 5 Drawing Figures

U.S. Patent     Aug. 9, 1977     4,040,893
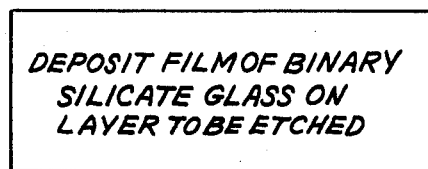
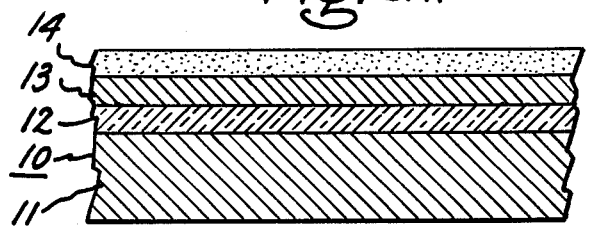
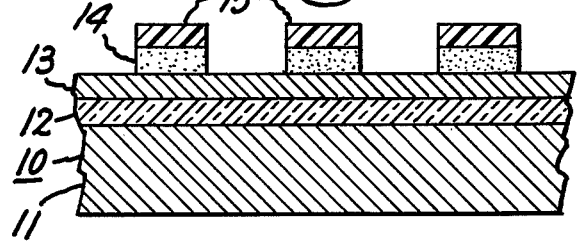
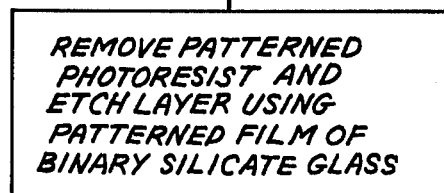
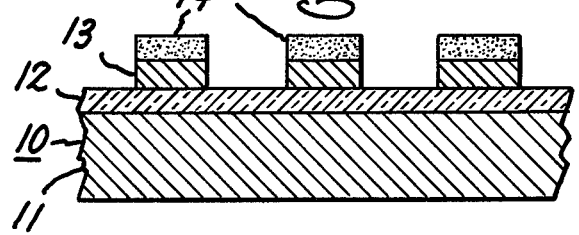
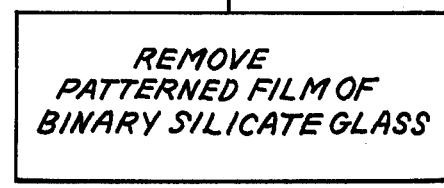
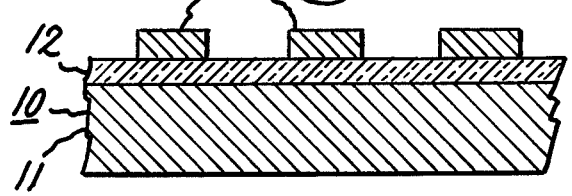

METHOD OF SELECTIVE ETCHING OF MATERIALS UTILIZING MASKS OF BINARY SILICATE GLASSES

The present invention related in general to the method of etching a layer of material utilizing an etch mask of a binary silicate glass, and in particular relates to a method of etching a layer of material on a silicon dioxide substrate utilizing a mask of binary silicate glass.

In the fabrication of semiconductor devices utilizing silicon dioxide substrates it is often necessary to pattern layers of such materials as indium tin oxide, antimony tin oxide, polycrystalline silicon, silicon nitride and other conductive, semiconductive and insulating materials. The usual procedure for patterning layers of materials is to utilize photolithographic techniques in which a patterned photoresist is provided over the layer. The portions of the layer exposed by the patterned photoresist are etched in suitable etchants to form the desired pattern in the layer. In etching such materials as specified above, either concentrated solutions of etchants or hot etchants or both are necessary to remove the exposed portions thereof. Under these conditions available photoresist materials become unsuitable because of loss of adhesive quality and integrity. Accordingly, it has been necessary to utilize a material for the etch mask which is resistant to the etchants utilized under such conditions of temperature and concentration. A suitable mask material is silicon dioxide as silicon dioxide can be readily deposited at relatively low temperatures, provides good adherence to materials such as specified above, and is able to withstand hot and concentrated solutions of various etchants. However, when silicon dioxide is used in the substrate as well as a transfer mask, a problem is presented when it is desired to remove the mask of silicon dioxide after completion of the etching operation. The etchant which is utilized for the removal of the etch mask also removes or undercuts a portion of the silicon dioxide in the substrate and hence damages the resultant structure.

The present invention is directed to overcoming problems such as pointed out above in the fabrication of semiconductor devices on silicon dioxide substrates.

Accordingly, an object of the present invention is to provide a new and improved method of etching a variety of materials formed on silicon dioxide substrates into desired patterns without impairing the silicon dioxide substrates.

Another object of the present invention is to provide an improved method of etching layers of materials utilizing binary silicate glass.

In carrying out the present invention in accordance with one illustrative embodiment thereof as applied to the formation of a desired pattern in a layer of material, such as antimony tin oxide, formed on the surface of a substrate including silicon dioxide, there is deposited a film of a binary silicate glass, such as a borosilicate glass, on the exposed surface of the layer. A pattern is formed in the film of borosilicate glass identical to the desired pattern thereby exposing portions of the layer of material uncovered by the patterned film. Conventional photolithographic masking and etching techniques are used to form the desired pattern in the binary silicate glass. The layer of antimony tin oxide exposed by the film is etched in a hot concentrated solution of hydroiodic acid to form in the layer the desired pattern. Hot concentrated hydroiodic acid does not appreciably effect either the silicon dioxide in the substrate or the binary silicate glass. The patterned film of binary silicate glass overlying the patterned layer is removed with a second etchant which does not etch either the silicon dioxide or the layer of antimony tin oxide. If the binary silicate glass used is a borosilicate glass a suitable etchant is tetrafluoroboric acid which neither appreciably attacks or etches either the antimony tin oxide or the silicon dioxide substrate.

The novel features which are believed to be characteristic of the present invention are set forth with particularity in the appended claims. The invention itself with further objects and advantages thereof may best be understood by reference to the following description taken in connection with the accompanying drawings wherein FIG. 1 is a flow diagram illustrating the steps utilized in practicing the present invention.

FIGS. 2A, 2B, 2C and 2D illustrate partial cross-sections of structures in successive steps in the etching method in accordance with this invention.

The present invention will be described initially in connection with the application thereof to the etching of layers of antimony tin oxide. Reference is now made to FIG. 1 and to FIG. 2A which shows a section of a wafer or substrate 10 including a body 11 of silicon on which a layer 12 of silicon dioxide has been grown thermally. On the exposed surface of the silicon dioxide layer 12, a layer 13 of antimony tin oxide has been deposited. The antimony tin oxide may be deposited by various techniques one of which is disclosed and claimed in a copending patent application Ser. No. 674,547, filed Apr. 7, 1976, and assigned to the assignee of the present invention. In accordance with the present invention a layer or film 14 of a binary silicate glass is deposited on the exposed surface of the layer 13 of antimony tin oxide. The binary silicate glasses preferred are borosilicate glass and phosphosilicate glass. Borosilicate glass is formed by use of a diborane, silane, oxygen and argon reaction system at a substrate temperature in the range of 350° to 450° C, for example. Phosphosilicate glass is formed by using a phosphine, silane, oxygen and argon reaction system at substrate temperatures in the range of 350° to 450° C, for example.

Reference is now made to FIG. 2B which shows the film 14 of a binary silicate glass patterned into a desired pattern having retained and removed portions in which the removed portions expose surface portions of the layer 13 of antimony tin oxide. In patterning the film 14 of binary silicate glass conventional photolithographic techniques are utilized in which the pattern desired in the binary silicate glass is formed in the photoresist 15. The patterned photoresist is utilized as an etch mask for etching the binary silicate glass. When the binary silicate glass is a borosilicate glass, a concentrated solution of tetrafluoroboric acid is used for etching the exposed portions of the layer 14. The tetrafuoroboric acid does not attack the photoresist or the underlying layer of antimony tin oxide. If the binary silicate glass is a phosphosilicate glass, an etchant suitable for etching the exposed portions of the layer 14 of glass without attacking the photoresist or the underlying layer of antimony tin oxide is a suitable buffered hydrofluoric acid, for example, a solution consitituted of 1 part hydrofluoric acid (48%), 9 parts of an aqueous solution of ammonium fluoride (40%), and 90 parts of water by volume.

At this point in the process as the binary silicate glass has been patterned using the photoresist no further need exists for the photoresist and it may be stripped. The photoresist is removed in a suitable photoresist stripper such as hot Chem Strip made by the Mallinckrodt Chemical Company of St. Louis, Mo. After suitable rinsing the composite body is now ready for subsequent processing. The composite body of FIG. 2B is immersed in a hot concentrated solution of hydroiodic acid for a time sufficient to etch away the portions of layer 13 of antimony tin oxide which have been exposed to produce the composite body shown in FIG. 2C. With a hot concentrated hydroiodic acid solution of 48% hydrogen iodide and with an antimony tin oxide layer thickness of about 1.0 micron all of the exposed antimony tin oxide is etched away without appreciably affecting the binary silicate mask in about 5 minutes. Hot concentrated hydroiodic acid etches silicon dioxide very slowly.

To prepare the composite body of FIG. 2C for further processing into semiconductor devices it is necessary to remove the binary silicate glass mask. In accordance with the present invention the patterned film 14 of binary silicate glass is removed with an etchant which does not etch or attack the silicon dioxide substrate layer 12 or the layer 13 of antimony tin oxide. When the binary silicate glass is a borosilicate glass a suitable etchant which meets these requirements is tetrafuoroboric acid which is the same acid which is used initially in patterning a film 14 constituted of borosilicate glass. When the binary silicate glass is phosphosilicate glass an etchant which meets these requirements is P-etch. A suitable P-etch solution is 3 parts hydrofluoric acid (48%), 2 parts of nitric acid (70%), 60 parts of water by volume. After removal of the silicate glass, patterned binary composite body of FIG. 2D is obtained in which pattern portions of antimony tin oxide have been formed on a substrate layer 12 of silicon dioxide without affecting the silicon dioxide substrate layer 12.

Layer 13 may be constituted of other materials such as indium tin oxide, silicon, cadmium sulfide, gallium phosphide, gallium arsenide, silicon nitride, aluminum oxide, platinum, tungsten and gold. The etching of the foregoing materials requires hot concentrated solutions of either acids or bases, or strongly oxidizing chemicals such as hydrogen peroxide. In such cases available photoresists are not suitable etch mask materials as they are adversely affected by heat and oxidizing agents, i.e. the adherence of the photoresist to the layer to be etched is weakened or the integrity thereof is impaired. Accordingly, conventional photolithographic masking and etching techniques utilizing organic polymer photoresists are unsuitable for etching a desired pattern into a layer of materials requiring such etches. Silicon dioxide which may be patterned using conventional photolithographic masking and etching techniques is a suitable material for use in transfer masks for etching such materials. However, when silicon dioxide is used in the substrate on which the layer 13 is included, the removal of the transfer mask of silicon dioxide also affects the operative layer of silicon dioxide in the substrate.

In accordance with the present invention the problem outlined above is avoided by use of another material for the transfer mask which may be selectively etched without affecting the silicon dioxide. I have found that the binary silicate glasses, in particular the borosilicate glasses and the phosphosilicate glasses, are suitable etch mask materials. The borosilicate glass is readily etched by tetrafluoroboric acid which does not attack silicon dioxide and in general does not attack materials commonly used in semiconductor device fabrication. The etchant utilized for removal of the phosphosilicate glass is P-etch which likewise does not attack silicon dioxide perceptibly and does not attack materials commonly used in semiconductor devices.

When the layer 13 is constituted of a material such as antimony tin oxide including tin oxide as a major constituent and antimony oxide as a minor constituent, hot concentrated hydroiodic acid is a suitable etchant for the layer. This etchant etches only very slowly the other materials utilized. Hot hydroiodic acid does not perceptibly attack silicon, the silicon dioxide, borosilicate glass or phosphosilicate glass. When the layer is constituted of indium tin oxide an etchant suitable for etching patterns in the layer 13 is concentrated hydrobromic acid which etches at most very slowly the other materials used. When the layer 13 is constituted of a material such as doped polycrystalline silicon, a suitable etchant is hot concentrated potassium hydroxide (a 40% solution by weight potassium hydroxide at 60° C), which etches at most very slowly the other materials used. When the layer 13 is constituted of an insulating material, such as silicon nitride, a suitable etchant is hot phosphoric acid which etches at most very slowly the other materials used.

The following specific examples illustrate the method of the invention and some of the structures made thereby. These examples are provided for purposes of illustration only and are not to be construed in a limiting sense.

EXAMPLE 1

A substrate including a body of silicon on which a layer of silicon dioxide has been thermally grown to a thickness of about 1000 Angstroms is provided. After suitably cleaning the exposed surface of the silicon dioxide layer, a layer of antimony tin oxide is formed on the exposed surface of the silicon dioxide layer. The antimony tin oxide is constituted for about 1 per cent by weight of antimony oxide and the remainder tin oxide and has a thickness of approximately 1 micron. The antimony tin oxide layer is deposited by the method described and claimed in patent application Ser. No. 674,547, filed Apr. 7, 1976, and assigned to the assignee of the present invention. The layer of antimony tin oxide is deposited on a substrate heated to a temperature of about 500° C, in a reactor in which a mixture of vapors of tetramethyl tin, vapors of antimony pentrachloride and oxygen in a carrier gas of argon in proportions appropriate to the 1% of antimony oxide desired in the deposited layer, are passes over the heated substrate to produce the resultant layer. The deposition is allowed to proceed for a period of time to produce the desired thickness of 1 micron. The layer of antimony tin oxide could also have been formed thereon by other means such as sputtering from a suitable source of antimony tin oxide. Next in the process, a film of a borosilicate glass is formed on the surface of the layer of antimony tin oxide. Conveniently the borosilicate glass is constituted of 30 mole per cent of boron oxide and the remainder is silicon dioxide and has a thickness of about 3000 Angstroms. The borosilicate glass is conventionally deposited using a diborane, silane, oxygen and argon reaction system at substrate temperatures in the range of 350° to 450° C. The film of borosilicate glass is patterned using photolithographic mask and etching techniques in which a hardened pattern of a photoresist is formed on the glass identical to the pattern of retained portions desired in the borosilicate glass film. The borosilicate glass film is covered or capped by a thin layer of silicon dioxide about 500 Angstroms thick deposited in the same reactor but without phosphine flow. The purpose of the capping layer of silicon dioxide is to prevent absorption of moisture from the environment by the boron oxide component of the borosilicate glass thereby improving photoresist adhesion to the surface of the borosilicate glass film.

The composite body with the hardened photoresist is next etched in a solution of tetrafluoroboric acid (48% solution by weight of $HBF_4$) which rapidly etches the uncovered portions of the borosilicate glass with inappreciable effect on the other materials of the composite body. The hardened photoresist is then removed with a suitable photoresist stripper such as Chem Strip made by the Mallinckrodt Corporation of St. Louis, Mo. Using the patterned borosilicate glass the layer of antimony tin oxide is next etched in hot concentrated hydroiodic acid. The reaction is allowed to proceed for about 5 minutes, a time sufficient to etch the exposed portions of the antimony tin oxide and thereby produce in the antimony tin oxide layer a pattern identical to the pattern in the film of borosilicate glass. The hot concentrated hydroiodic acid has an imperceptible effect on the other materials of the composite body. The borosilicate glass is then removed by the tetrafluoroboric acid etch which is used initially in patterning the film of borosilicate glass as this etchant has imperceptible effect on the underlying layer of silicon dioxide on which the patterned antimony tin oxide layer is formed. The process of etching antimony tin oxide utilizing hot hydroiodic acid is described and claimed in a copending patent application Ser. No. 676,370, filed Apr. 12, 1976, and assigned to the assignee of the present invention.

EXAMPLE 2

A substrate identical to the substrate of Example 1, including a body of silicon on which a layer of silicon dioxide has been formed is provided. A layer of antimony tin oxide is deposited identically as in Example 1 on the exposed surface of the silicon dioxide layer, and in place of the film of borosilicate glass a film of a phosphosilicate glass (5 mole per cent of phosphorous pentoxide) 3000 Angstroms thick is provided on the exposed surface of the layer of antimony tin oxide using a phosphine, silane, oxygen and argon reaction system and maintaining the substrate temperatures in the range of 350°–450° C. The phosphosilicate glass film is covered or capped by a thin layer of silicon dioxide about 500 Angstroms thick deposited in the same reactor but without phosphine flow. The purpose of the capping layer of silicon dioxide is to prevent absorption of moisture from the environment by the phosphorous pentoxide component of the phosphosilicate glass thereby improving photoresist adhesion to the surface of the phosphosilicate glass film. The phosphosilicate glass is patterned using the conventional photolithographic masking and etching technique used with the borosilicate glass. However, in place of the etchants used in Example 1, buffered hydrofluoric acid (1 part hydrofluoric (40%), 9 parts of an aqueous solution of ammonium fluoride (40%), 90 parts of water by volume) is used to etch the exposed portions of the phosphosilicate glass. The buffered hydrofluoric acid selectively etches the phosphosilicate glass without having appreciable effect on the other materials of the composite body. After removal of the photoresist as in Example 1, the layer of antimony tin oxide with the patterned film of phosphosilicate glass thereon is etched in hot concentrated hydroiodic acid as in Example 1. After etching the layer of antimony tin oxide, P-etch is utilized to remove the patterned film of phosphosilicate glass to provide the resultant composite body including a substrate of silicon dioxide on which is provided a desired pattern in the layer of antimony tin oxide.

EXAMPLE 3

A substrate identical to the substrate of Example 1, including a body of silicon on which a layer of silicon dioxide has been formed is provided. A layer of indium tin oxide 0.5 micron thick is sputtered on the exposed surface of the silicon dioxide layer. The sputtering is accomplished in r-f sputtering apparatus in which the target electrode is a disc of pressed and sintered indium tin oxide in the proportion of about 90% indium oxide and 10% tin oxide by weight and in which the atmosphere is argon at reduced pressure. The body is suitably annealed at about 400° C for ten minutes to densify the indium tin oxide and to improve the conductivity thereof. Thereafter, a film of borosilicate glass as in Example 1 is applied to the layer of indium tin oxide and patterned in the same manner specified in Example 1. The exposed portions of the layer of indium tin oxide are etched in a solution of concentrated hydrobromic acid for a time sufficient to etch away the indium tin oxide which had been uncovered by the removed portions of the borosilicate glass. Thus, the pattern of the retained and removed portions in the borosilicate glass are transferred to the layer of indium tin oxide. With 48% concentrated solution of hydrobromic acid, etch action takes about 20 minutes. The hydrobromic acid has imperceptible affect on the layer of silicon dioxide exposed by the etching of the layer of indium tin oxide. The concentrated hydrobromic acid also has imperceptible effect on the borosilicate glass and the silicon of the composite body. The patterned film of borosilicate glass is removed using tetrafluoroboric acid which has imperceptible effect on the patterned layer of indium tin oxide. The process of etching indium tin oxide utilizing hydrobromic acid is described and claimed in a copending patent application Ser. No. 573,843, filed May 2, 1976, now U.S. Pat. No. 3,979,240, and assigned to the assignee of the present invention.

EXAMPLE 4

A substrate identical to the substrate of Example 3, including a body of silicon on which a layer of silicon dioxide has been formed is provided. The process steps carried out are identical to the process steps of Example 3 except that in place of the transfer mask of borosilicate glass a film of phosphosilicate glass is applied to the layer of indium tin oxide. The film of phosphosilicate glass is constituted, applied and patterned identically as in Example 2. The layer of indium tin oxide is etched as in Example 3 using hydrobromic acid. Concentrated hydrobromic acid has imperceptible effect on the transfer mask of phosphosilicate glass. P-etch is used for removal of the phosphosilicate glass after the underlying layer of indium tin oxide has been appropriately etched to provide the desired pattern therein.

EXAMPLE 5

A substrate identical to the substrate of Example 1 including a body of silicon on which a layer of silicon dioxide has been formed is provided. A layer of polycrystalline silicon 5000 Angstroms thick is provided over the exposed surface of the silicon dioxide layer and doped with phosphorus to provide low resistance. The polycrystalline silicon is deposited using a silane decomposition reaction at a temperature of 700° C in nitrogen ambient. Thereafter, a film of borosilicate glass 3000 Angstroms thick is provided over the polycrystalline silicon layer. The borosilicate glass film is patterned as in Example 1 using tetrafluoroboric acid. Tetrafluoroboric acid has imperceptible effect on polycrystalline silicon doped with phosphorus. Using the mask of borosilicate glass, the layer of polycrystalline silicon is etched using a concentrated solution of potassium hydroxide at 60° C for about 5 minutes. Concentrated potassium hydroxide applied for that period of time has imperceptible effect on either the borosilicate glass mask, the underlying substrate layer of silicon dioxide or on the silicon. After appropriately cleaning and rinsing the resultant composite body the film of borosilicate glass is removed utilizing tetrafluoroboric acid.

EXAMPLE 6

A substrate identical to the substrate of Example 5 including a body of silicon and a layer of silicon dioxide thereon is provided. The substrate is processed identically to the processing of the wafer of Example 5 to provide a layer of phosphorus doped polycrystalline silicon 5000 Angstroms thick thereon. Thereafter, in place of utilization of a film of borosilicate glass, a phosphosilicate glass film 3000 Angstroms thick and constituted of 5 mole per cent of phosphorous pentoxide is provided thereon is a manner specified in Example 2. The film of phosphosilicate glass is patterned as specified in Example 2. Using the transfer mask of phosphosilicate glass the underlying layer of phosphorus doped polycrystalline silicon is then etched using concentrated hot potassium hydroxide as in Example 5 to etch a pattern in the layer of polycrystalline silicon identical to the pattern in the transfer mask of phosphosilicate glass. Hot concentrated potassium hydroxide has imperceptible effect on the transfer mask of phosphosilicate glass during the etching operation. The concentrated solution of potassium hydroxide has imperceptible effect on the adhesiveness of the transfer mask to the polycrystalline layer or on its integrity. After the desired pattern is etched in the polycrystalline silicon layer on the phosphosilicate glass is removed using P-etch.

EXAMPLE 7

A substrate identical to the substrate of Example 1 including a body of silicon on which a layer of silicon dioxide has been formed is provided. A layer of silicon nitride 1000 Angstroms thick is formed on the exposed surfaces of silicon dioxide by deposition from a mixture of silane and ammonia in a carrier gas of hydrogen on a substrate maintained at a temperature in the range 850°–950° C. Thereafter, a film of borosilicate glass is applied thereto and patterned as in Example 1. The exposed portions of the layer of silicon nitride are etched in a concentrated solution of a hot phosphoric acid maintained at a temperature of about 180° C for a time sufficient to etch the exposed portions of a silicon nitride to the underlying layer of silicon dioxide. The concentrated phosphoric acid has imperceptible effect on the underlying layer of silicon dioxide during the time utilized for etching. Also, the concentrated hot phosphoric acid solution has imperceptible effect on the borosilicate glass or the underlying silicon layer. After completion of the etching of the silicon nitride layer, the transfer mask of borosilicate glass is removed utilizing tetrafluoroboric acid. Tetrafluoroboric acid has imperceptible effect on the silicon nitride during the time used for etching the borosilicate glass.

EXAMPLE 8

A substrate identical to the substrate of Example 7 including a body of silicon on which a layer of silicon dioxide has been formed is provided. A layer of silicon nitride 1000 Angstroms thick is formed on the exposed surfaces of the layer of silicon dioxide in the manner specified in Example 7. In place of the borosilicate glass film of Example 7, a film of phosphosilicate glass 3000 Angstroms thick is utilized. The film of phosphosilicate glass is patterned into a desired pattern utilizing the technique described in connection with Example 2. The transfer mask of phosphosilicate glass is then utilized to etch the layer of silicon nitride using the hot concentrated solution of phosphoric acid of Example 7. Hot concentrated phosphoric acid has imperceptible effect on the film of phosphosilicate glass. After the desired pattern has been etched in the underlying layer of silicon nitride, the film of phosphosilicate glass is removed utilizing P-etch.

While in the examples set forth above the binary silicate glasses utilized are borosilicate and phosphosilicate glasses, it will be understood that other binary glasses may be used. In this case etchants suitable for etching the binary silicate glass selectively without affecting the other elements of the layer would be used. Also, while borosilicate glass of a particular composition was utilized in the examples, it will be understood that the percentage of boron oxide in the borosilicate glass may be varied from small percentages to large percentages, for example, from about 15% to about 35%, depending upon the relative rates of etching desired. Similarly, while the phosphosilicate glass utilized in the examples included phosphorous oxide of 5 mil percent, other percentages may be utilized, for example, from about 3 to about 10 mole per cent. With very low percentages of phosphorous pentoxide the glass becomes essentially silicon dioxide and hence it is not possible to selectively etch the glass in relation to the underlying layer of silicon dioxide. When the phosphorous pentoxide content of the phosphosilicate glass becomes large, that is greater than about 5 mole percent, a considerable quantity of moisture is absorbed by the phosphorous pentoxide. The presence of moisture impairs the adhesion of photoresist to phosphosilicate glass and hence would affect its functioning as a transfer mask. To alleviate this problem, a thin layer of silicon dioxide is provided over the film of the phosphosilicate glass, for example a layer a few hundred Angstroms thick, to seal the phosphosilicate glass film from environmental moisture prior to application of photoresist. A thin layer of silicon dioxide is also provided on the film of borosilicate glass as the boron oxide constituent is also hydroscopic and absorbs appreciable moisture, particularly, when included in high concentrations in the glass film.

While the invention has been described in connection with the etching of particular materials such as antimony tin oxide, indium tin oxide, polycrystalline silicon and silicon nitride, it will be understood that the invention is not limited to use in connection with these materials.

While in the examples, the layer of material to be etched is deposited on a substrate of silicon dioxide, it will be understood that the layer to be etched may be deposited on a substrate of a material other than silicon dioxide, but which includes a region of silicon dioxide having an exposed portion.

While the invention has been described in specific embodiments it will be appreciated that modifications, such as those described above, may be made by those skilled in the art, and it is intended by the appended claims to cover all such modifications and changes as fall within the true spirit and scope of the invention.

What I claim as new and desire to secure by Letters Patent of the United States is:

1. A method of etching a first pattern in a layer of material formed on the surface of a substrate including a region of silicon dioxide comprising
   depositing a film of a binary silicate glass on the exposed surface of said layer,
   forming in said film a second pattern which is substantially identical to said first pattern to expose portions of said layer of material uncovered thereby,
   etching said uncovered portions of said layer with a first etchant which does not etch silicon dioxide,
   removing said film of binary silicate glass with a second etchant which does not etch silicon dioxide or the material of said layer.

2. The method of claim 1 in which said layer of material is formed on said region of silicon dioxide.

3. The method of claim 1 in which said film of binary silicate glass is selected from the class of borosilicate and phosphosilicate glasses.

4. The method of claim 3 in which said film is a borosilicate glass and in which said second etchant is tetrafluoroboric acid.

5. The method of claim 3 in which said film is a phosphosilicate glass and in which said second etchant is P-etch.

6. The method of claim 3 in which said layer of material is indium tin oxide having a major constituent of indium oxide.

7. The method of claim 6 in which said first etchant is concentrated hydrobromic acid.

8. The method of claim 3 in which said layer of material is antimony tin oxide having a major constituent of tin oxide.

9. The method of claim 8 in which said first etchant is hot concentrated hydroiodic acid.

10. The method of claim 3 in which said layer of material is polycrystalline silicon.

11. The method of claim 10 in which said first etchant is concentrated hot potassium hydroxide.

12. The method of claim 3 in which said layer of material is silicon nitride.

13. The method of claim 12 in which said first etchant is concentrated hot phosphoric acid.

* * * * *